United States Patent [19]
Kumomi et al.

[11] Patent Number: 5,726,464
[45] Date of Patent: Mar. 10, 1998

[54] LIGHT EMITTING DEVICE USING POROUS SEMI-CONDUCTOR MATERIAL

[75] Inventors: Hideya Kumomi, Yokohama; Takao Yonehara, Atsugi, both of Japan

[73] Assignee: Canon Kabushiki Kaisha, Tokyo, Japan

[21] Appl. No.: 670,150

[22] Filed: Jun. 27, 1996

Related U.S. Application Data

[63] Continuation of Ser. No. 219,543, Mar. 29, 1994, abandoned.

[30] Foreign Application Priority Data

Mar. 29, 1993 [JP] Japan ................................ 5-069938
Mar. 18, 1994 [JP] Japan ................................ 6-049022

[51] Int. Cl.$^6$ ............................................ H01L 33/00
[52] U.S. Cl. ................... 257/103; 257/94; 257/99; 257/101
[58] Field of Search ..................... 257/94, 99, 101, 257/103

[56] References Cited

U.S. PATENT DOCUMENTS

| | | | |
|---|---|---|---|
| 5,285,078 | 2/1994 | Mimura et al. | 257/3 |
| 5,298,767 | 3/1994 | Shor et al. | 257/22 |
| 5,324,965 | 6/1994 | Tompsett et al. | 257/103 |
| 5,360,759 | 11/1994 | Stengl et al. | 437/20 |
| 5,458,735 | 10/1995 | Richter et al. | 156/662.1 |

FOREIGN PATENT DOCUMENTS

| | | | |
|---|---|---|---|
| 0588296 | 3/1994 | European Pat. Off. | H01L 21/306 |
| 4126955 | 2/1993 | Germany | H01L 33/00 |

OTHER PUBLICATIONS

IBM Technical Disclosure Bulletin, vol. 36, No. 3, Mar. 1993, New York U.S., pp. 289–290, "Electroluminescent Device Based on Silicon Semiconductor".

Applied Physics Letters, vol. 60, No. 20, May 18, 1992, New York US, pp. 2514–2516, F. Namawar et al., "Visible electroluninesence from porous silicon PN hetrojunction diodes".

Pickering, et al., "Optical studies of the structure of porous silicon films formed in p-type degenerate and non–degenerate silicon", *J. Phys. C:Solid State Phys.*, 17, 6535–6552 (1984).

Unagami, et al., "Structure of Porous Silicon Layer and Heat–Treatment Effect", *J. Electrochem. Soc.*, vol. 125, No. 8, 1339–1344, Aug. 1978.

Mii, et al., "Observation of large oscillator strengths for both $1 \to 2$ and $1 \to 3$ intersubband transitions of step quantum wells", *Appl. Phys. Lett.*, vol. 56, No. 11, 1046–1048, 12 Mar. 1990.

Koshida, et al., "Visible electroluminescence from porous silicon", *Appl. Phys. Lett.*, vol. 60, Nno. 3, 347–352, 20 Jan. 1992.

Richter, et al., "Current–Induced Light Emission from a Porous Silicon Device", *IEEE Electron Device Letters*, vol. 12, No. 12, 691–692, Dec. 1991.

Namavar, et al., "Visible electroluminescence from porous silicon np heterojunction diodes", *App. Physics Letters*, vol. 60, No. 20, 2514–2516, 18 May 1992.

Futagi, et al., "Visible Electroluminescence from P–Type Cystalline Silicon/Porous Silicon/N–Type Microcrystalline Silicon Carbon PN Junction Diodes", *Jpn. J. Appl. Phys.*, Part 2, vol. 31, No. 5B, L616–L618, 15 May 1992.

(List continued on next page.)

*Primary Examiner*—Ngân V. Ngô
*Attorney, Agent, or Firm*—Fitzpatrick, Cella, Harper & Scinto

[57] ABSTRACT

A light emitting device comprises a luminous region comprising a luminous porous material comprising a crystalline semiconductor, and a non-porous region adjacent to the luminous region, wherein a conductive type between the regions is different at an interface between the luminous region and the non-porous region, and the crystal structure between the regions is continuous.

9 Claims, 10 Drawing Sheets

OTHER PUBLICATIONS

Campbell, et al., "Photoluminescence of porous silicon buried underneath epitaxial GaP", *Appl. Phys. Lett.*, vol. 60, No. 7, 889–891, 17 Feb. 1992.

Halimaoui, et al., "Electroluminescence in the visible range during anodic oxidation of porous silicon films", *Appl. Phys. Lett.*, vol. 59, No. 3, 304–306, 15 Jul. 1991.

Bressers, et al., "Visible light emission from a porous silicon/solution diode", *Appl. Phys. Lett.*, vol. 61, No. 1, 108–110, 6 Jul. 1992.

Bustarret, et al., "Visible light emission at room temperature from anodized plasma–deposited silicon thin films", *Appl. Phys. Lett.*, vol. 61, No. 13, 1552–1554, 28 Sep. 1992.

Canham, et al., "Efficient visible electroluminescence from highly porous silicon under cathodic bias", *Appl. Phys. Lett.*, vol. 61, No. 13, 2563–2565, 23 Nov. 1992.

FIG. 1
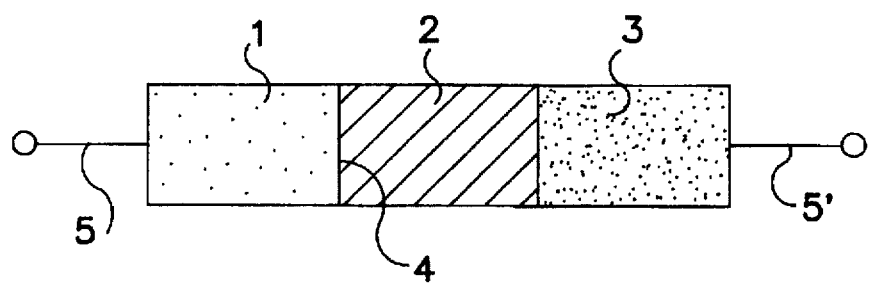
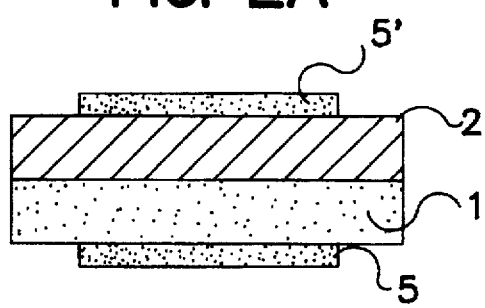
FIG. 2A
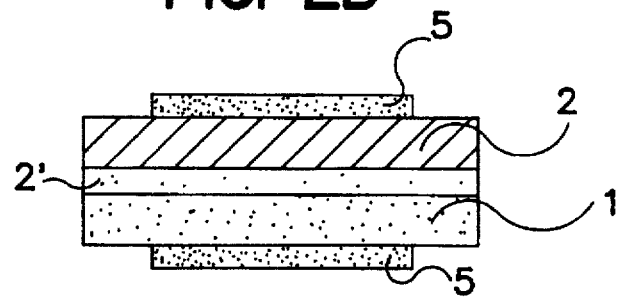
FIG. 2B
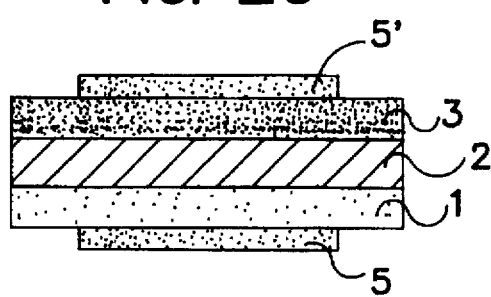
FIG. 2C
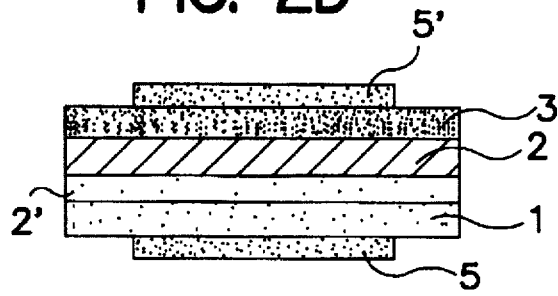
FIG. 2D

LIGHT EMITTING DEVICE USING POROUS SEMI-CONDUCTOR MATERIAL

This application is a continuation of application Ser. No. 08/219,543, filed Mar. 29, 1994, now abandoned.

BACKGROUND OF THE INVENTION

1. Field of the Invention

The present invention relates to a light emitting device and a light emitting device manufacturing method.

2. Related Background Art

Recently, porous materials have been remarkable as a new functional material used for an active structure factor in a device. The porous structure of IV-group semiconductor crystal, for example, has been chiefly used for the conventional SOI (Silicon On Insulator) structure forming process (refer to T. Unagami and M. Seki, J. Electrochem. Soc. 125, 1339 (1978)) because of its rapid oxidation capability. In this case, raw material has been used only as a structural material, in no connection with its electronic and optical properties. However, recently research and development has been vigorously pursued toward an application to light emitting devices which originates from a luminous phenomenon at room temperatures and with high efficiency (refer to L. T. Canham, Appl. Phys. Lett. 56, 1046 (1990)) because of the luminous phenomenon at low temperature (refer to C. Pickering, et al., J. Phys. C17, 6535 (1984)) due to a microstructure with a desirable carrier quantum closing effect. Generally, the porous structure itself can be easily shaped by processing a raw material. If certain problems are overcome applying such porous materials functionally may provide a very attractive new technology.

One largest obstacle which impedes putting the porous material to practical use is that it is difficult to inject current to the porous region. An active light emitting device must function as an electroluminescence (EL) device. In order to realize an EL device with higher efficiency, it is desirable to use a current injection-type device. It has been so far reported that a light emitting diode (LED) using a solid-state electrode on a current injection layer indicates for lower efficiency, in comparison with the potential high photoluminescence (PL) efficiency of the same porous material. For example, the naked eye can clearly recognize under normal room illumination that a porous silicon layer which is formed by anodizing the surface of a monocrystalline silicon substrate in a hydrofluoric acid solution is luminous over the visible range in response to an illumination by a several-watt ultraviolet lamp so that the PL energy efficiency exceeds several %. However, since the current injection which is performed via a Schottky junction between a semi-transparent gold electrode and the same porous layer has less than a quantum efficiency of $10^3$% (refer to N. Koshida, et al., Appl. Phys., Lett. 60, 347 (1992)), a very high applied voltage of several hundred volts is needed to produce a feeble luminescence recognizable with the naked eye in a dark place (refer to A. Richter, et al, IEEE Electron Device Lett. 12, 691 (1991)). No remarkable improvement is seen in the LED including a conductive transparent electrode (refer to F. Namavar, et al., Appl. Phys. Lett. 60, 2514 (1992)) of an injection electrode of indium tin oxide, an n-type micro-crystalline silicon carbide film (µc-SiC) (refer to T. Futagi, et al, Jpn. J. Appl. Phys. 31, L616 (1992)), and a pn-heterojunction, in order to overcome such a situation. In the example where an n-type gallium phosphorus (GaP) is used for the same purpose, even current injection has not been yet succeeded in an actual case (refer to J. C. Campbell, et al., Appl. Phys. 60, 889 (1992)).

On the other hand, it has been reported that current injection is which a porous silicon layer is immersed in an electrolytic solution used for an anodization to utilize the solid-liquid interface in the internal walls in pores of the porous silicon improves the luminous efficiency, compare with the above solid-state electrode (refer to A. Halimaoui, et al. Appl. Phys. Lett. 59, 304 (1991), P. M. M. C. Bressers, et al, Appl. Physl. Lett. 61 108(1992), E. Bustarret, et al, Appl. Lett. 61, 1552(1992), L. T. Canham, et al., Appl. Phys. Lett. 61, 2563 (1992). The above method is poor in practical use because the porous silicon layer is etched as a result of the light emission so that the light emission soon disappears. However, it is noted that there is a possibility that the current injection efficiency may strongly dominate the injection-type EL efficiency of porous silicon. From this viewpoint, it is considered that the poor interface between the electrode and the luminous porous silicon layer impedes the current injection, thus causing the poor emitting efficiency of the solid-state injection electrode type LED. Therefore, it is desirable to introduce a new injection electrode material with good interface properties over the above heterojunction example.

SUMMARY OF THE INVENTION

In order to overcome the above-mentioned technical problems, an object of the present invention is to provide a light emitting device which has a reduced contact resistance between its electrode and its luminous region.

Another object of the present invention is to provide a light emitting device which can perform current injection with high efficiency.

Still another object of the present invention is to provide a light emitting device having an excellent luminous efficiency.

These objects are attained, according to the present invention by providing a light emitting device which has a non-porous region adjacent to a luminous region which comprises a luminous porous material comprising a crystalline semiconductor, wherein the luminous region and the non-porous region have a different conductivity type to each other at their interface and the crystal structure between the regions is continuous.

These and other objects, features and advantages of the present invention will become apparent from the following drawings and detailed description taken in connection with the drawings.

BRIEF DESCRIPTION OF THE DRAWINGS

FIG. 1 is a schematic diagram showing a structural embodiment of the light emitting device according to the present invention;

FIGS. 2A to 2D are schematic-diagrams each showing an embodiment of the light emitting device according to the present invention;

DETAILED DESCRIPTION OF THE PREFERRED EMBODIMENTS

Figure 3A:
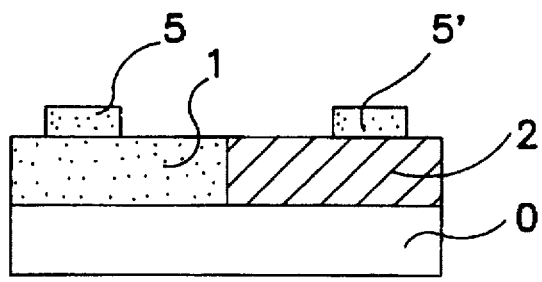
FIGS. 3A to 3D are schematic diagrams each showing an embodiment of the light emitting device according to the present invention.

The present invention results form that the present inventors having zealously studied to overcome the above problems.

The light emitting device according to the present invention is characterized by a luminous region which comprises a luminous porous material comprising a crystalline semiconductor, and a non-porous region adjacent to the luminous region, wherein the luminous region and the non-porous region have a different conductive type to each other at their interface and the crystal structure between the regions is continuous.

The first preferred embodiment of the present invention is a method of manufacturing a light emitting device which is characterized by the steps of forming a member having a non-porous crystal region and a porous crystal region of a conductivity type different from that of the non-porous crystal region, so as to make continuous the crystal structure of the porous crystal region; and the crystal structure of the non-porous crystal region; and forming a luminous region in the porous crystal region.

The second preferred embodiment of the present invention is a method of manufacturing a light emitting device which is characterized by the steps of forming a member having a non-porous crystal region; making a conductive type of the porous crystal region different from that of the non-porous crystal region and a porous crystal region so as to make continuous the crystal structure of the porous crystal region and the crystal structure of the non-porous crystal region; and forming a luminous region in the porous crystal region.

According to the present invention, the light emitting device has an element structure where a non-porous region with a continuous crystal structure is arranged to be adjacent to a luminous region comprising a porous material, the non-porous region acting as an electrode for injecting current into the luminous region, so that the perfect bonding between the electrode and the luminous region reduces contact resistance. The current can be injected from the junction region with high efficiency by making the conductivity type of the non-porous region different form that of the luminous region. As a result, a light emitting device can be provided which has a good luminous efficiency and is practical as an entire element.

An explanation will be made below in detail as for the light emitting device and the light emitting device manufacturing method according to the present invention, with reference to the drawings.

FIG. 1 is a schematic cross sectional view showing the most conceptual element structure of an light emitting device according to the present invention. The light emitting device has a structure where the luminous region 2 comprising a luminous porous materials is sandwiched between the current injection electrode regions 1, 3. The injection electrode region 1 is formed of non-porous material with a low resistance which is same as the mother material for the luminous region 2. The interface 4 between regions 1 and 2 has a continuous crystal structure. These regions have a different conductive type from each other, and a homogeneous pn-type junction is formed there. The injection electrode regions 3 does not depend on its structure if it is of a low resistance. The injection electrode region 3 has the same conductive type as that of the luminous region 2. The interface between regions 2 and 3 has a continuous crystal structure. When a DC current is conducted between the injection electrode regions 1 and 3 via the extracting electrode 5 and 5' connected to the device, electric charges are injected form the homogeneous pn-type junction interface 4 to the luminous region 2 so that light emission occurs. Alternatively, the extracting electrode 5' can be directly bonded to the light emitting region 2 with a low contact resistance, and the injection electrode region 3 can be omitted.

The point of the present invention will be described by studying how the interface property affects the current injection efficiency of the entire element. First, (1) the good ohmic contact between the extracting metal contact 5 and the injection electrode region 1 is confirmed because the injection electrode region 1 is formed of a non-porous material with low resistance. (2) A good homogeneous pn-junction can be formed because the crystal structure continues at the junction interface 4 between the injection electrode region 1 and the luminous region 2 of the same material and along both the regions sharing a common mother material. As described above in Related Background Art, the interface characteristics dominate current injection efficiency and the luminous efficiency of the element. Hence, the light emitting device according to the present invention has a high efficiency by forming an injection electrode region which is in non-porous structure, which has a crystal structure continuous with that of the luminous region 2, and which is of the same material and of heterojunction-type. Moreover, when the injection electrode region 3 is provided, (3) the contact between the luminous region 2 and the injection electrode region 3 is no matter because of continuity of crystal structure, and (4) it is expected that good ohmic contact between the injection electrode region 3 and the extracting electrode 5' results from the low resistivity of the injection electrode region 3.

It is not necessary that the luminous region 2 is made of a uniform luminous porous material along the whole region. The luminous region may be formed of plural porous or non-porous regions of different structure. It is required that at least one of the regions must be a luminous material. Therefore, if other regions are offered as other uses then the luminous function, both the device characteristics and the device manufacturing method may be convenient in some cases. For example, the vicinity of the interface of the injection electrode region 1 is made of non-porous, or non-luminous porous, material having relatively large residual structure, whereby the pn-junction can further be improved at the interface 4. Of the light emitting device manufacturing methods according to the present invention (to be described later), the method which uses an epitaxial growth can further improve the epitaxial interface and the film quality of an epitaxial layer.

In the porous material existing in the light emitting region 2, the structure is formed of the same mother material as the injection electrode region 1 or 3, whereby it is not important that hetero-material may be formed on the surfaces facing pores in the residual structure. Moreover, all spaces in a pore may be filled with a hetero-material. Generally, in some cases, the mechanical and thermal stability is inadequate because the luminous porous material has a very fine residual structure. Hence, in some cases, an effective reinforcement may be made using the above hetero-material.

FIGS. 2A to 2D illustrate a spacial arrangement of a luminous region comprising a non-porous region and a luminous porous material as a more concrete embodiment of a light emitting device according to the present invention.

FIGS. 2A to 2D show an example where a current route is vertically formed on the surface of a monocrystalline substrate in wafer form. In the most simplified device structure, shown in FIG. 2A, a pn-junction is formed between the non-porous layer 1 of a first conductive type and the luminous porous layer 2 of a second conductive type, with a continuous crystal structure in the pn-junction. The extracting electrodes 5 and 5' are provided on the ends of the element structure, respectively. (Like numerals represent regions corresponding to those in FIG. 1.) Depending on the interface characteristics, the intermediate layer 2' can be arranged between the nonporous layer 1 and the luminous porous layer 2 (FIG. 2B). This example shows that the luminous region 2 includes a region other than the luminous porous region in the structure shown in FIG. 1. That is, the intermediate layer 2' includes the luminous region 2 shown in FIG. 1. The intermediate region 2' may be formed of, for example, a non-luminous porous material or a non-porous material including monocrystal. However, the conductive type of the intermediate 2' should be same as that of the luminous porous layer 2, and the layers on the front and back of the intermediate layer 2' should be continued in crystal structure. However, it is not necessarily needed that the interface between the intermediate layer 2' and other layer in the luminous region 2 is sharp, but it may be varied restrictively and continuously. Depending on the characteristics of the interface between the extracting electrode 5' and the luminous porous layer 2, additional injection electrode layer 3 may be provide (FIG. 2C). This is an example showing the injection electrode 3 which is provided in the device structure shown in FIG. 1. The injection electrode layer 3 is formed of, for example, a non-luminous porous material or non-porous material including monocrystal. However, the conductive type of the injection electrode layer 3 should be same as the luminous non-porous layer 2. The crystal structure between the injection electrode layer 3 and the luminous non-porous electrode layer 2 should be continuous. However, the interface is not necessarily needed to be sharp, but may restrictively and continuously vary. FIG. 2D illustrates an example in which the intermediate layer 2' serves also as the injection electrode layer 3.

FIGS. 3A to 3D are an embodiment showing that an electrode route is formed in a direction parallel to a surface of noncrystalline film provided on the insulation surface of, for example, the substrate in wafer form O. Each structural element and its function correspond to those shown in FIGS. 2A to 2D. The extracting electrodes 5 and 5' are in contact with the film surface. However, the geometric arrangement is not limited to the present example.

Next, as for the light emitting device manufacturing method according to the present invention, the device of an embodiment shown in FIGS. 2A to 2D and 3A to 3D will be explained in accordance with a process for forming a light emitting region comprising a luminous porous material and a non-porous region each having a different conductive type, so as to form a continuous crystal structure.

Figure 4A:
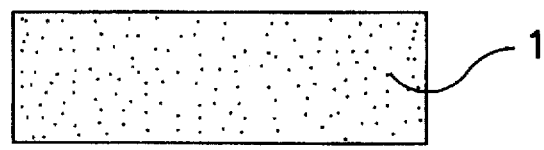
FIGS. 4A to 4C are schematic diagram diagrams showing an embodiment of a light emitting device manufacturing process according to the present invention.
Figure 4B:
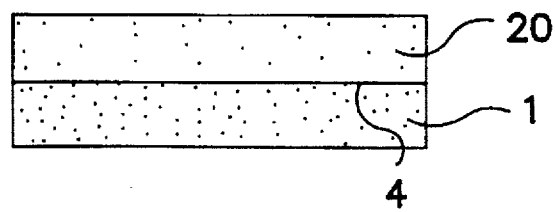
Figure 4C:
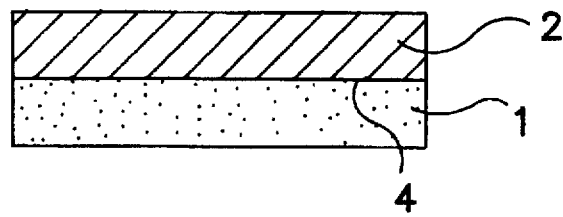

The first method of manufacturing a device with the structure shown in FIG. 2A is shown in FIGS. 4A to 4C. Fist, a non-porous substrate 1 having desired conductive type and resistance is prepared (FIG. 4A). The layer 20, which has a conductive type different from that of the substrate 1 but has the same mother material and has a continuous structure at the interface 4, is provided on the surface of the substrate 1 (FIG. 4B). In a concrete method, the layer 20 may be formed by epitaxial growth on the surface of the substrate 1 with impurity elements being introduced to control the conductive type, or the layer 20 can be internally formed from the surface of the substrate 1 by effecting counter-doping by ion implantation from the surface of the substrate 1, or solid-phase diffusion from a deposited, or diffusion from a gas-phase, film. Moreover, it is possible to combine the above methods. Next, the luminous region 2 comprising a luminous porous material can be made by making the layer 20 porous from the surface to the interface 4 by using a method of converting a non-porous material into a porous material, such as anodization or a photo-formation (FIG. 4C). Next, the extracting electrodes 5 and 5' are formed. Finally, a device with the structure shown in FIG. 2A can be formed. Since the pn-junction interface 4 has a continuous crystal structure before a porous structure formation, the original state is maintained even after a final step.

Figure 5A:
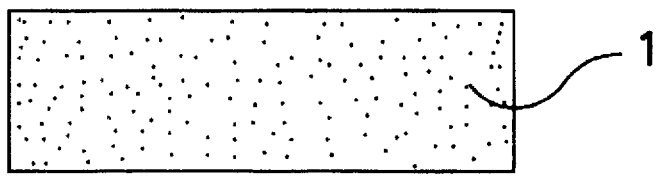
FIGS. 5A to 5C are schematic diagram diagrams showing an embodiment of a light emitting device manufacturing process according, to the present invention.
Figure 5B:
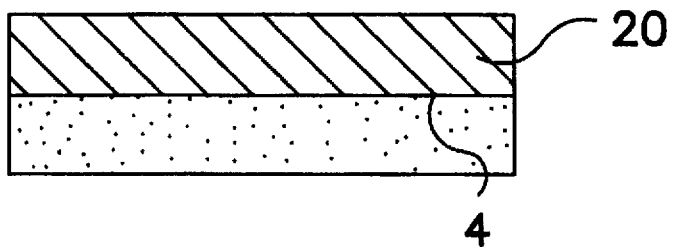
Figure 5C:
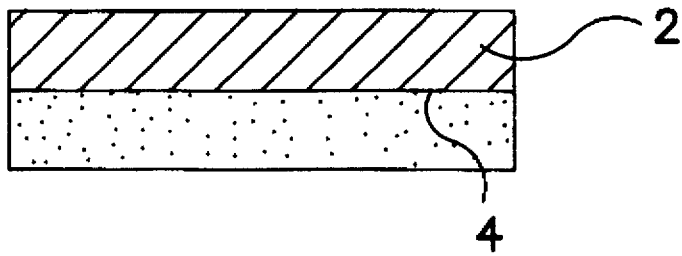

Next, the second method of manufacturing a device with the structure whose in FIG. 2A is shown in FIGS. 5A to 5C. First, a non-porous substrate 1 with a desired conductive type and a desired resistance is prepared (FIG. 5A). A porous structure formation is effected from the surface of the substrate 1 to a desired depth (FIG. 5B). Next, a counter-doping is carried out from the surface of the porous structure formation layer 20 to make the luminous porous layer 2 having a different conductive type from that of the substrate 1 (FIG. 5C). Then a device with the structure shown in FIG. 2A can be formed by forming the extracting electrodes 5 and 5'. In the same manner as in FIGS. 4A to 4D, the crystal structure, needless to say, is continuous at the pn-junction interface 4.

Figure 6:
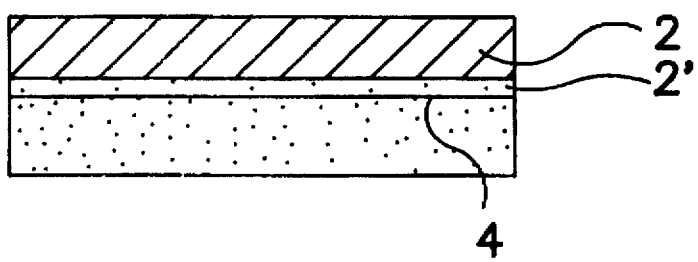
FIG. 6 is a schematic diagram showing an embodiment of a light emitting device manufacturing process according to the present invention.
Figure 7:
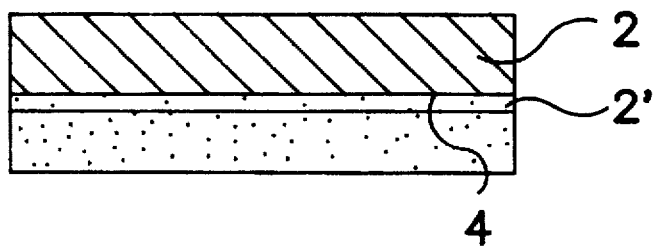
FIG. 7 is a schematic diagram showing an embodiment of a light emitting device manufacturing process according to the present invention.

Methods of manufacturing the device shown in FIG. 2B will be described as follows. The first methods can be performed by slightly modifying the methods each which forms the device shown in FIG. 2A explained by referring to FIGS. 4A to 4C and 5A to 5C. First, in the step shown in FIG. 4B, the intermediate layer 2' is left to a desired thickness by terminating porous structure formation must before the formation reaches the interface 4 from the surface of the layer 2 (FIG. 6). In the step shown in FIG. 4C, a counter-doping is effected over the surface of the porous structure formation layer 20 to the non-porous region of the substrate 1 to form the intermediate layer 2' having a desired thickness (FIG. 7). In either case, the intermediate layer 2' is made of a non-porous material of the same conductive type as that of the luminous porous layer 2 and has a continuous crystal structure at the pn-junction interface 4 to the substrate 1.

Figure 8A:
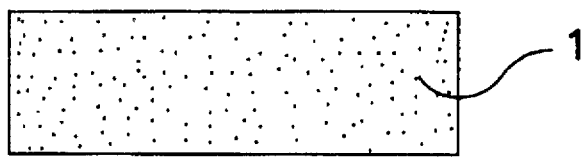
FIGS. 8A to 8C are schematic diagrams showing an embodiment of a light emitting device manufacturing process according to the present invention.
Figure 8B:
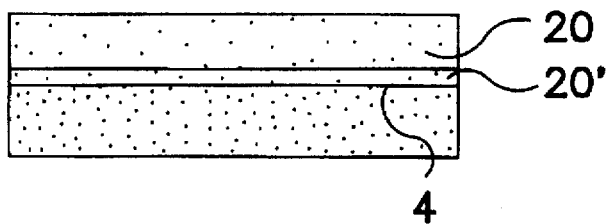

The second method of manufacturing the device shown in FIG. 2B is not applied to the step in which a pn-junction is formed by counter-doping after the porous structure layer is formed as shown in FIGS. 5A to 5C. The reason is that the phenomenon is utilized, that both the porous structure formation and the porous material structure are largely influenced by the composition of non-porous material, impurity concentration, and other factors. For example, in the porous silicon formation by anodization, the structure strength increases because then a heavy impurity concentration is a silicon substrate lowers a resistance, the residual structure is large and the porous degree lowers, thus suppressing a resistance increase due to porous material. IN this case, a non-luminous porous material is formed. In the steps explained with reference to FIGS. 8A to 8C, a non-luminous porous material of low resistance is used as the intermediate layer 2' shown in FIG. 2B. First, the non-porous substrate 1 having a desired conductive type and resistance is prepared (FIG. 8A). On a surface of the substrate, the layer 20', which has conductive type different from that of the substrate 1 but has the same mother material and has a continuous crystal structure at the interface 4, is provided. Further, the layer 20, which has the same conductive type as that of layer 20' but has a different impurity concentration and has a continuous crystal structure is provided (FIG. 8B). For example, the impurity concentration of the layer 20' may be set to a higher amount than that of the layer 20. The process used in the step shown in FIG. 4B can be used in the concrete method of manufacturing the layer 20 and 20'. For example, when a formation is effected by epitaxial growth, layer 20 may be deposited after a deposition of the layer 20'. In ion implantation, multiple step ion-implantation with varying implanting energy conditions for ion species, or an ion-implanting profile may be used, whereby the spatial transition between the layers 20 and 20' becomes continuous. Next, by making the layers 20 and 20' porous from the surface to the interface 4 (FIG. 8C), the luminous region 2 comprising a luminous porous material, the layer 20' acting as the intermediate layer 2', is formed. Then the extracting electrodes 5, 5' are formed on the luminous region 2 to form a light emitting device with the structure shown in FIG. 2B. In this case, the crystal structure at the pn-junction interface is continuous.

Figure 9A:
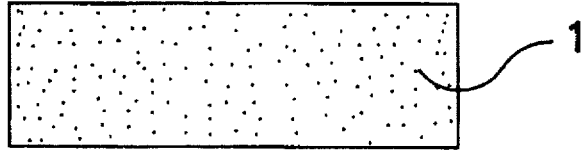
FIGS. 9A to 9C are schematic diagrams showing an embodiment of a light emitting device manufacturing process according to the present invention.
Figure 9B:
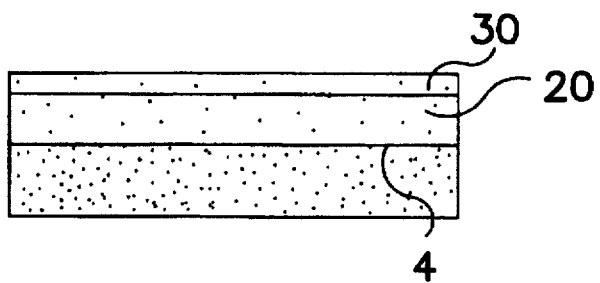
Figure 9C:
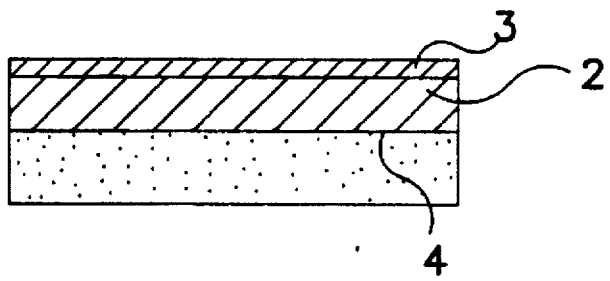

Next, the first method of manufacturing a device with the structure shown in FIG. 2C is shown in FIGS. 9A to 9C. First, the non-porous substrate 1 having a desired conductive type and resistance is prepared (FIG. 9A). On a surface of the substrate, the layer 20, which has a conductive type different from that of the substrate 1 but has the same mother material and has a continuous crystal structure at the interface 4, is provided. Further, the layer 30, which has the same conductive type as that of the layer 20 and has a different impurity concentration, is provided (FIG. 9B). For example, the impurity concentration of the layer 30 may be higher than that of the layer 20. The process used in the step shown in FIG. 4B can be used as the concrete method of manufacturing the layers 20 and 30. For example, the formation is effected by epitaxial growth, the layer 30 is deposited after a deposition of the layer 20. In ion implantation, multiple step ion-implantation with varying implanting energy conditions or ion species, or an ion-implanting profile may be used, whereby the spatial transition between the layers 20 and 30 becomes continuous. Next, by making the layers 30 and 20 porous from the surface to the interface 4 (FIG. 9C), both the layers become an injection electrode layer 3 of a non-luminous porous material and the luminous layer 2 comprising a luminous porous material. Then the extracting electrodes 5 and 5' are formed on the luminous layer 2 to form a light emitting device with the structure shown in FIG. 2B. In this case, the crystal structure at the pn-junction interface 4 is continuous.

Figure 10A:
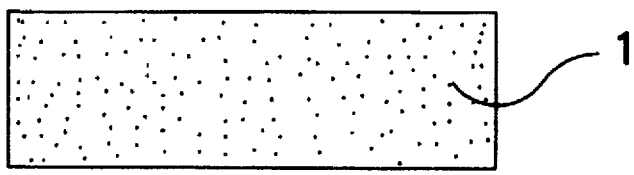
FIGS. 10A to 10D schematic diagrams showing an embodiment of a light emitting device manufacturing process according to the present invention.
Figure 10B:
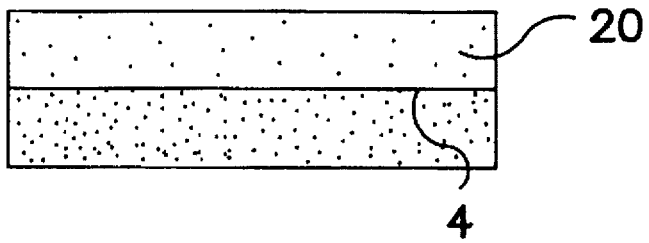
Figure 10C:
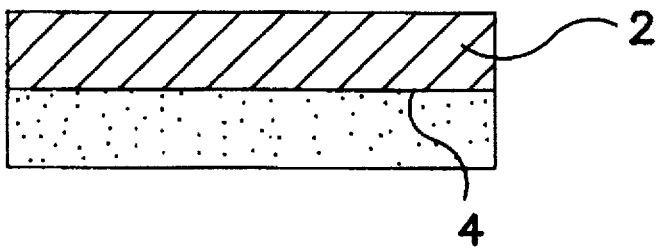
Figure 10D:
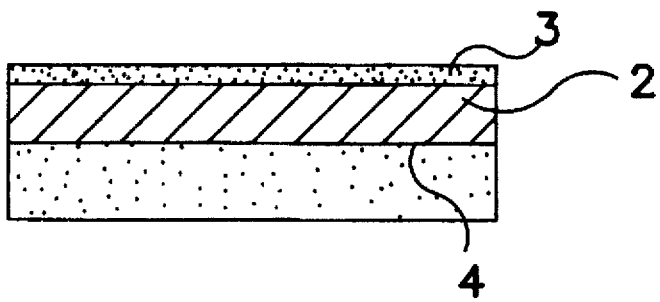

The second method of manufacturing a device with the structure shown in FIG. 2C is shown if FIGS. 10A to 10D. First, the non-porous substrate 1 having a desired conductive type and a resistance is prepared (FIG. 10A). On a surface of the substrate, the layer 20, which has a conductive type different from that of the substrate 1 but has the same mother material and has a continuous crystal structure at the interface 4, is provided (FIG. 10B). The concrete method of manufacturing the layer 20 is the same as the process described above. Next, the layer 20 is made porous from the surface to the interface 4 to form the luminous layer 2 comprising a luminous porous material (FIG. 10C). The injection electrode layer 3 of a non-porous material is deposited on the surface by epitaxial growth etc. (FIG. 10D). Since the injection electrode layer 3 should be of the same conductive type as that of the light emitting device 2 and have a low resistance, the impurities are introduced at a deposition or are doped in a later step.

Figure 11:
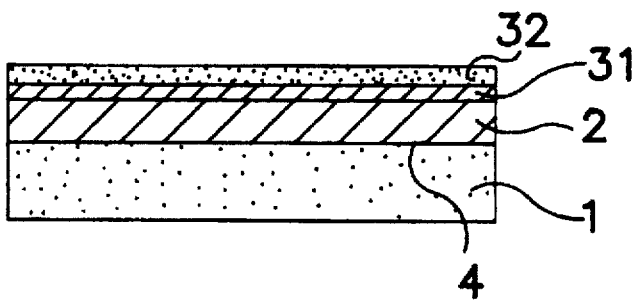
FIGS. 11 is a schematic diagram showing an embodiment of a light emitting device manufacturing process according to the present invention.

By performing both the first and second methods for forming a device with the structure shown in FIG. 2C, it is possible to form the injection electrode layer 3 of the plural layers shown in FIG. 11. In this case, the non-porous injection electrode layer 32 may be deposited by epitaxial growth, etc., on the non-luminous porous injection electrode layer 31 formed according to the first method.

Figure 12A:
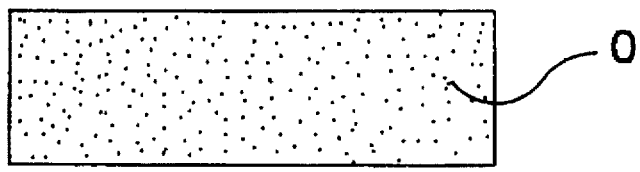
FIGS. 12A to 12D schematic diagrams showing an embodiment of a light emitting device manufacturing process according to the present invention.
Figure 12B:
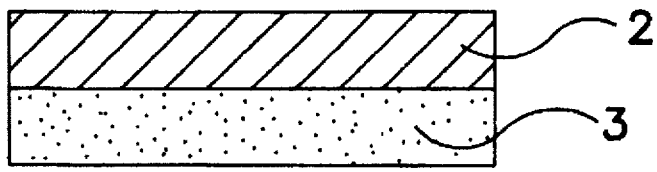
Figure 12C:
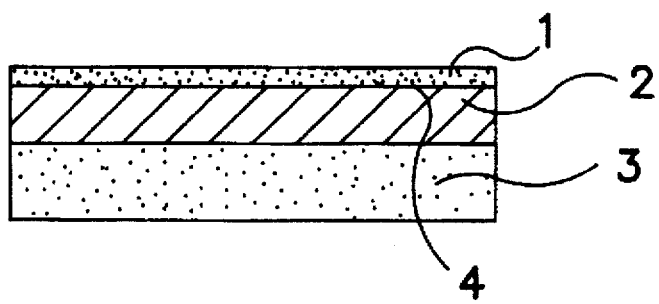
Figure 12D:
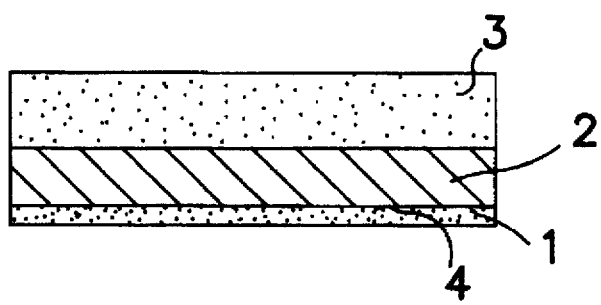

In the third method for manufacturing a device shown in FIG. 2C, the order of the layer manufacturing steps described above is reversed. The third process will be explained below with reference to FIGS. 12A to 12D. First, the non-porous substrate 0 having a desired conductive type and a resistance is prepared (FIG. 12A). The substrate 0 is made porous to a desired depth from the surface thereof to form the luminous layer 2 comprising a luminous porous material (FIG. 12B). The injection electrode layer 1 is deposited by epitaxial growth, etc., on the surface of the substrate 0 (FIG. 12C). In this case, the injection electrode layer 1 should be of a non-porous material with a low resistance. The interface 4 between the injection electrode layer 1 and the luminous layer should be a continuous crystal structure and the substrate) should be different from the luminous layer 2 in a conductive type. Therefore, it is required that impurities are introduced at a deposition or are doped in a later step. Putting the substrate upside down makes the structure shown in FIG. 12D. The pn-junction interface 4 is formed between the injection electrode layer 1 finally deposited and the luminous layer 2. The injection electrode layer 3 which has the same conductivity as that of the luminous layer 2 in the substrate) left without being made porous is formed on the luminous layer 2. The extracting electrodes 5 and 5' are formed to obtain a device shown in FIG. 2C.

The device shown in FIG. 2D can be formed by combining the method of manufacturing the device shown in FIG.

Figure 13:
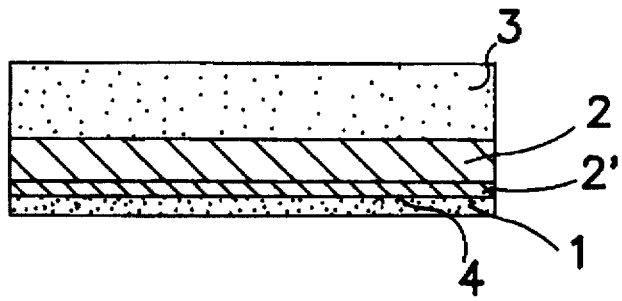
FIGS. 13 is a schematic diagram showing an embodiment of a light emitting device manufacturing process according to the present invention.

2B and the method of manufacturing the device shown in FIG. 2C. For example, referring to FIG. 2A, after a layer which is of the same conductive type as that of the substrate 0 and has a high impurity concentration is formed on the surface of the non-porous substrate 0, the process goes to the steps shown in FIG. 12B. Thus the high impurity concentration layer is converted to the intermediate layer 2' of non-luminous porous material so that the structure shown in FIG. 13 is obtained and the device shown in FIG. 2D can be formed.

The method of manufacturing the device group shown in FIGS. 3A to 3D is the same as that shown in FIGS. 2A to 2D except that a non-porous film on the insulating surface of a substrate is made porous. An explanation will be made as for some typical forming steps with reference to the device structure in FIG. 3D as an example.

Figure 3B:
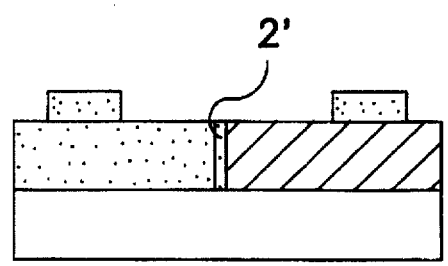
Figure 3C:
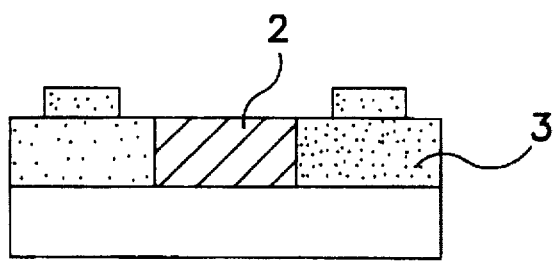
Figure 3D:
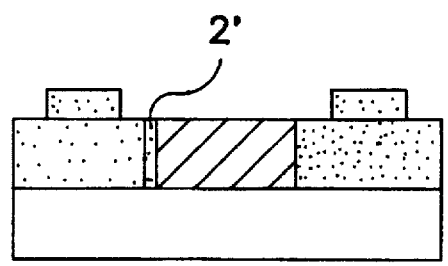
Figure 14A:
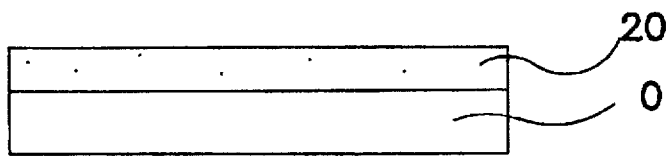
FIGS. 14A to 14F are schematic diagrams showing an embodiment of a light emitting device manufacturing process according to the present invention.
Figure 14B:
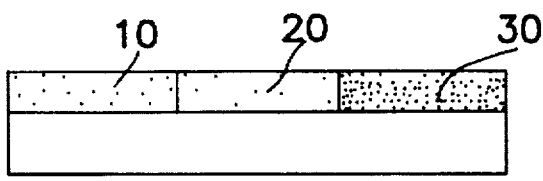
Figure 14C:
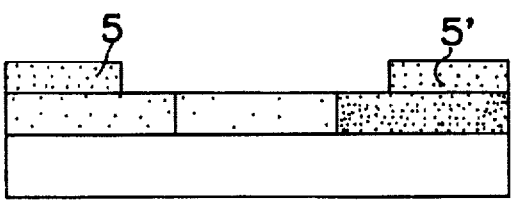
Figure 14D:
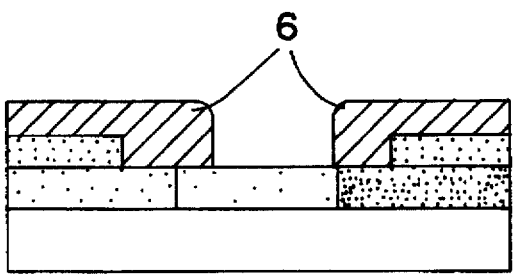
Figure 14E:
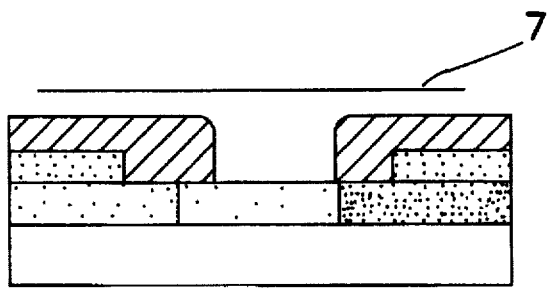
Figure 14F:
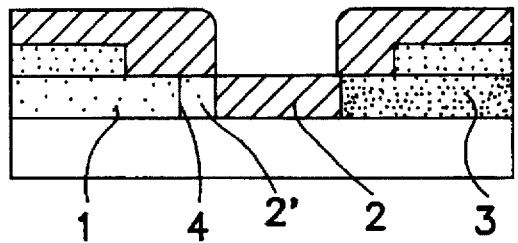

FIGS. 14A to 14F show the first method of manufacturing the device in FIG. 3D. First, a substrate on which a non-porous film 20 formed on the insulation surface of the substrate 0 is provided (FIG. 14A). Next, using photolithography process and a local doping process such as a focussed ion beam technique which are conventionally used in semiconductor integrated circuit fabrication, the region 10 having a conductive type different from that of the non-porous film 20 is formed in the non-porous film 20 and the region 30 having the same conductive type as that of the non-porous film 20 and having a high impurity concentration and a high resistance is formed (FIG. 14B). The take-out electrodes 5 and 5' in contact with the regions 10 and 30, respectively, are formed using the patterning technique (FIG. 14C). Furthermore, a protective layer 6 is formed over the electrodes 5 and 5' (FIG. 14D). Since the protective layer 6 protects the structure underneath it in the following step when the region 20 of the remaining non-porous film is subjected to a porous structure forming process, it must sufficiently withstand the porous structure forming process. The protective film 6 on the left end of the opening is offset from the boundary between the regions 10 and 20 a shown in the drawing. Next, the region 20 is converted into a porous layer. In the case where an anodizing process is used as a concrete porous structure forming process, the entire substrate is immersed in an electrolytic solution. Current is conducted between the take-out electrode 5' and the counter-electrode 7 (FIG. 14E). In the case of photoformation, the porous structure forming process is carried out merely by illuminating with uniform rays, in the above steps, of the region 20, the region underneath the opening in the protective film 6 is converted into the luminous region 2 including a luminous porous material, the offset part is converted into the intermediate layer 2', and the regions 10 and 30 are respectively converted into the injection electrode regions 1 and 3. The device shown in FIG. 3D having a pn-junction at the interface 4 with a continuous crystal structure is formed (FIG. 14F). If the offset of the protective film 6 at the opening is omitted, the device shown in FIG. 3C is formed. If formation of the region 30 is omitted, the device shown in FIG. 3B is formed. If the offset at the opening in the protective film 6 and formation of the region 30 are omitted, the device shown in FIG. 3A is formed.

Figure 15A:
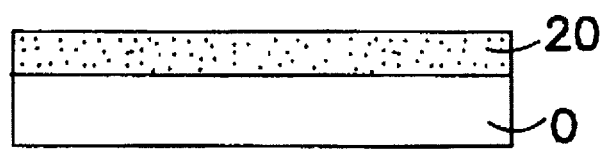
FIGS. 15A to 15D are schematic diagrams showing an embodiment of a light emitting device manufacturing process according to the present invention.
Figure 15B:
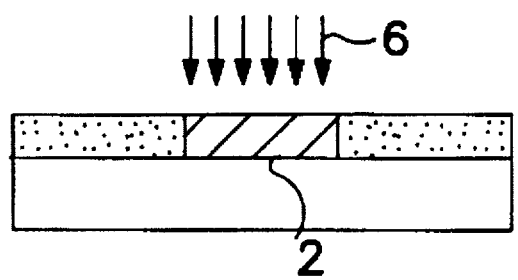
Figure 15C:
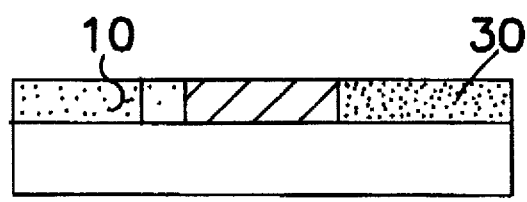
Figure 15D:
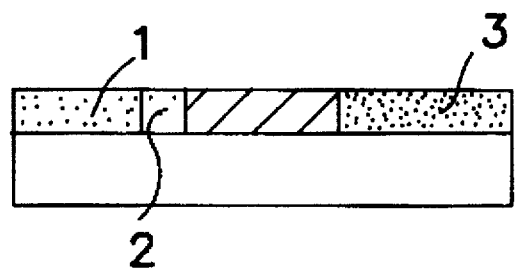

Next, the second method forming the devices shown in FIG. 3D will be explained with reference to FIGS. 15A to 15F. First, a substrate, comprising the non-porous film 20 formed on the substrate 0 having a insulation surface is provided (FIG. 15A). The entire substrate is immersed in an electrolytic solution. Then a photo-formation is carried out by illuminating a locally focused light 56 onto the non-porous film 20 to form the luminous region 20 including a luminous porous material (FIG. 15B). Sequentially, using a local doping technique, the region 10 having a conductive type different from that of the non-porous film 20 and the region 30 having the same conductive type as that of the non-porous film 20 and having a high impurity concentration and a low resistance are formed (FIG. 15C). According to the above steps, the structure shown in FIG. 3D, which includes the regions 10 and 30 respectively converted into the injection electrode regions 1 and 3 as well as the region remaining between the region 10 and the luminous region 2 converted into the intermediate layer 2', is formed (FIG. 15D). The devices shown in FIGS. 3A to 3C can be formed by changing the spatial position of the region 10, are omitting some steps.

[EXAMPLES]

A detailed explanation will be made below as for the examples of a light emitting device and a light emitting device manufacturing method according to the present invention with reference to examples using a silicon crystalline material.

Example 1

The example of a light emitting device having the structure shown in FIG. 2A shown with the forming steps in FIGS. 4A to 4C will be explained below.

First, a phosphorous-doped n-type silicon monocrystalline wafer which has a face orientation of <100> and a resistivity of 0.02 $\Omega$.cm is prepared. On the surface of the wafer, a p-type monocrystalline silicon layer of a thickness of about 1 µm was epitaxially grown using a CVD process simultaneously using dichlorosilane gas and diborane gas. Aluminum of a film thickness of 2000 Å was vapor-deposited on the back surface of the wafer to ensure perfect ohmic contact.

Next, only the wafer surface was contacted with a hydrofluoric acid ethanol solution of 20 wt % so as to face a platinum plane electrode. While the wafer surface was illuminated with a 1 kW halogen lamp, a DC voltage was applied between the wafer acting as an anode electrode and the platinum electrode. An anodization was performed for two minutes while maintaining the current density on the wafer surface to 10 mA.cm$^{-2}$. When the cross-section of a sample particularly prepared to confirm the porous structure formation was observed under an electron microscope with a high resolving power, it was confirmed that the anodization advanced just to a depth of 1 µm from the wafer surface to form a porous layer and the residual structure of the porous layer was perfectly continued to the crystal structure of the substrate. This means that the entire p-type epitaxially grown Si layer was converted into a porous layer. Illuminating the surface of the porous layer with a 5 watt ultra-violet lamp gave a red PL. Since the luminous porous layer had a very fine and brittle structure, only the surface of the residual structure was oxidized by an RTO (Rapid Thermal Oxidation) process to stabilize it. By this process, the PL emission peak was somewhat blue-shifted, and the strength was increased about five times.

After it was confirmed that the porous layer oxidized and having an increased PL efficiency was sufficiently stable, an SiO$_2$ film of a thickness of 2000 Å was again deposited on the wafer surface by using the CVD process. Then some 2 mm square opening s were formed in the oxide film by the conventional photolithography process. In forming the openings, the oxide film on the top surface of the oxidized porous layer as the underlying layer must also be removed.

Before reformation of a natural oxide film in the opening, a semi-transparent gold thin film of a thickness of 100 Å was deposited thereon. Moreover, an Al extracting electrode was wired from the opening.

When a DC current was conducted between the contacts on the front and the back surfaces of the wafer of the device prepared by the above process, a rectification characteristic was indicated where the current direction with the front surface contact side being the positive electrode is the forward direction, and a visible area luminescence of nearly orange color occurred from the openings in the oxide film at a threshold voltage of about 3 volts. It is assumed that this luminescence is electroluminescence due to a current injection into the porous silicon layer with an ultra-fine structure via the junction interface between the n-type monocrystalline layer of the substrate and the p-type porous layer just thereon. It is assumed that the reason the luminous threshold voltage is practically and sufficiently low, is that the continuous crystal structure in the pn-junction interface provides good rectification characteristics whereby the current injection efficiency is higher than that of a conventional structure.

Example 2

An explanation will be made as for an example of a light emitting device with the structure shown in FIG. 2B manufactured in the forming steps shown in FIG. 6.

A device was prepared by repeating the device preparation steps of Example 1 with the exception that the anodization time in was reduced by 1.5 seconds. When the cross-section of a sample particularly prepared to confirm the porous structure formation was observed under an electron microscope with a high resolving power, it was confirmed that the anodization had advanced from the wafer surface up to about 0.9 µm depth to form a porous layer, and that the lattice image was perfectly continuous, but a monocrystalline intermediate layer about 0.1 µm thick was formed between a contrast producing surface, which appeared to be an epitaxial interface, and a porous layer.

When a DC voltage was applied between the contacts on the front and back surfaces of the wafer, the device showed a rectification ration which is higher by nearly one order than that of the device of Example 1. The threshold voltage increased slightly to about 3.5 volts but a luminous efficiency was obtained which was several times stronger than that of the device of Example 1. It is presumed that the improved rectification characteristic results from the front and back portions of the pn-junction being formed of a perfect monocrystal. This improves the efficiency of current injection into the luminous porous layer, thus increasing the luminous efficiency.

Example 3

Figure 8C:
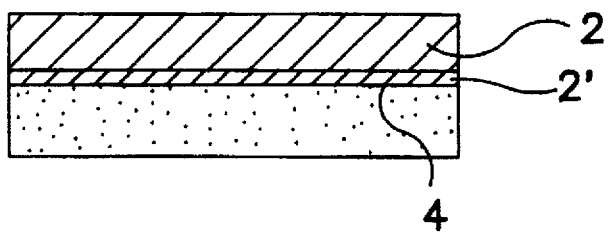

An explanation will be made as for an example of a light emitting device having the structure shown in FIG. 2B manufacture in the steps shown in FIGS. 8A to 8C.

A device was prepared by repeating the device preparation steps of Example 1 with the exception that the step of growing a p-type epitaxial layer on an n-type monocrystalline substrate was divided into two steps. The two steps for forming a p-type layer comprised depositing a heavily doped layer about 0.2 µm thick with the partial pressure of diborane gas increased ten times and then reducing the diborane gas partial pressure to the original pressure to grow a lightly doped layer about 0.2 µm thick.

The observation of the cross section of a sample found that the anodization proceeds from the wager surface to about 1 µm depth to form a porous layer. However, according to a further detailed observation, it was confirmed that a porous material having ultra-fine pores was formed to a depth of about 0.8 Mm from the wafer surface and the layer of a thickness of about 0.2 µm under the ultra-fine porous material was formed of a porous material of large pores having an average structure larger by about a factor of 100.

Conducting a DC current between the electrodes on the front and back surfaces of the wafer showed that the device had the intermediate characteristic between the devices according to example 1 and 2 in items including the rectification characteristics, luminous threshold voltage and luminous efficiency. In this case, it is presumed that the porous layer with large pores functions as an intermediate layer.

Example 4

An explanation will be made as for an example of a light emitting device having the structure shown in FIG. 2A manufactured in the steps in FIGS. 5A to 5C.

First, a boron-doped p-type silicon monocrystalline wafer having a face orientation of <100> and resistivity of 10Ω was prepared. Boron ions were accelerated at 50 KeV to be implanted into the back surface of the wafer with a dose or $5 \times 10^{14}$ cm$^{-2}$. Then the wafer was subjected to thermal annealing at 950° C. for 30 minutes in a nitrogen atmosphere to be activated.

Next, the substrate was arranged between a pair of parallel platinum plane electrodes and immersed in a hydrofluoric acid.ethanol solution of a concentration of 25 wt %. Anodization was performed by applying a DC voltage between one platinum electrode for one minute, with the region other than the wafer surface being electrically insulated, while the current density on the wafer surface was controlled to 10 mA.cm$^{-2}$. Then, the wafer was left for 10 minutes under normal room lighting, with the active circuit electrically short-circuited. When the cross-section of an observation sample prepared particularly to check the porous forming process was observed under a high resolution electron microscope, it was confirmed that the anodization advanced from the surface of the wager just to 0.5 µm deep to form a porous layer. When the surface of the porous layer was irradiated with a 5-watt ultraviolet lamp, a PL in red occurred.

Next, hydrogen ions accelerated at 30 KeV were implanted into the surface of the wafer with a dose of $1 \times 10^{15}$ cm$^{-2}$ and subjected to RTO to effect activation and porous structure stabilization. The PL luminous peak was somewhat blue-shifted and increased in intensity.

After it had been confirmed that the porous layer oxidized to have the increased PL efficiency was sufficiently stabilized, the oxide film on the top surface of the porous layer was removed with a dilute aqueous hydrofluoric acid solution. Before reformation of a natural oxide film, ITP was vapor-deposited to a thickness of 1500 Å and then patterned in 5 mm square in the fashion of island. An AlSi film was deposited on the entire back surface of the wafer by sputtering.

When a DC current was conducted between the electrodes on the front and the back surfaces of the wafer of the device produced by the above steps, a rectification characteristic was indicated, where the current with the front surface electrode being the positive electrode is the forward direction, and a visible area luminescence of nearly orange color occurred from the ITO island portions at a threshold voltage of about 5 volts. It is considered that the light emission is electroluminescence due to a current injection to the porous silicon layer with a ultra-fine structure via the junction interface between the p-type monocrystalline layer of the substrate and the porous layer as provided just on the p-type layer and changed to n-type by activation of hydrogen ions. It is presumed that the luminous threshold voltage being low sufficiently for practical use results from the continuous crystal structure in the pn-junction interface providing good rectification characteristic, and the current injection efficiency is higher than the conventional one.

Example 5

An explanation will be made as for an example of a light emitting device having the structure shown in FIG. 2B manufactured in the process shown in FIG. 7.

A device was prepared by following the procedure of Example 4 with the exception that the accelerating energy for the hydrogen ion implantation was boosted to 45 KeV, and the dose amount was doubled. Although it is difficult to clearly determine by a cross-section observation, it is presumed that the n-type region extend to the inside of the monocrystalline substrate through the porous layer.

When a DC current was conducted between the electrodes on the front and back surfaces of the wager, the device indicated a rectification ration begin higher by nearly one order of magnitude than the device of Example 4. The threshold voltage increase slightly to about 6 volts, but the luminous efficiency as obtained was several times stronger than that in Example 4. It is presumed that the improved rectification characteristic results from the from and back regions of the pn-junction interface being formed of a perfect monocrystal and that this improves the efficiency of current injection into the luminous porous layer, thus increasing the luminous efficiency.

Example 6

An explanation will be made as for an example of a light emitting device having the structure shown in FIG. 2C manufactured in the step shown in FIGS. 9A to 9C.

A device was prepared by following the procedure of Example 1 with the exception that after a p-type epitaxial layer had been grown on an n-type monocrystalline substrate, boron ions were implanted into the surface thereof at an accelerating voltage of 20 KeV with a dose of $5 \times 10^{14}$ $cm^{-2}$ and the substrate was subjected to thermal annealing in a nitrogen atmosphere at 950° C. for 30 minutes to be activated. An observation of the cross-section of a sample found that the anodization advances from the wafer surface up to about 1 µm depth to form a porous layer. In further detailed observation, it was recognized that the surface was of a porous layer having large pores and a thickness of about 0.05 µm and the underlying lower porous layer was almost of a ultra-fine porous layer.

When a DC current was conducted between the from and the back surfaces of the wafer, both the rectification characteristic and the luminous threshold voltage were substantially the same as those in Example 1, and the luminous efficiency was improved to several times that in Example 1. In this case, it is considered that since the porous layer with large pore structure on the outer surface acts as the injection electrode layer 3 shown in FIG. 2C, the contact resistance with the extracting electrode is reduced so that the luminous efficiency is improved.

Example 7

An explanation will be made as for an light emitting device with the structure shown in FIG. 2C manufactured in these steps in FIGS. 10A to 10D.

A device was prepared by following the procedure of Example 1 with the exception that the following step was added between the RTO treatment to the porous layer and the $CVD-SiO_2$ layer deposition step. The added step includes removing the oxide film on the top surface of the porous layer with the oxidized surface of the residual structure, and then epitaxially growing a p-type silicon layer of a 300 Å thick by using a bias sputtering method in which a heavily doped p-type silicon target is used. In an observation of the cross section of a sample, innumerable defects including twins and dislocations were observed in the epitaxial silicon layer. However, it is confirmed that the crystal structure of the underlying porous layer was succeeded as an average structure.

On conducting a DC current between the front and the back surfaces of the wafer, it was indicated that the rectification characteristic and luminous threshold voltage of the device was substantially the same as those in Example 1, and the luminous efficiency was improved to several times that in Example 1. In this case, it is considered that since the epitaxial silicon layer on the surface acts as the injection electrode layer 3 shown in FIG. 2C the contact resistance with the extracting electrode is reduced so that the luminous efficiency is improved.

Example 8

An explanation will be made below as for a light emitting device with the structure shown in FIG. 2C formed in the steps shown in FIG. 11.

A device was prepared by following the procedure of Example 6 with the exception that the following step was added after the porous layer forming step and the RTO treating step. The added step is a step of, after an oxide film has been removed, epitaxially growing, a p-type silicon layer of about 150 Å thick by using a bias sputtering method where a p-type silicon with a high concentration was used as a target. In an observation of the cross section of a sample, an ultra-thin layer of about 0.05 µm in depth in the top surface side of the porous layer was converted to a porous structure with coarse pores. It may be said that the epitaxial layer on the porous layer is nearly a monocrystal because a defect or the like was not found therein. It is considered that the improved crystallinity of the epitaxial layer results from the epitaxial growth surface being porous with coarse pores, as compared with that in Example 7.

On conducting a direct current between the front and back surfaces of the wafer of the above device, the rectification characteristics of the device was substantially same as those in Example 6. The luminous threshold voltage was slightly increased, whereby the luminous efficiency was improved by about 50%. In this case, since the epitaxial layer on the top surface as well as the underlying porous layer with a coarse structure act as the injection electrode layer 3 shown in FIG. 2C, it is considered that the contact resistance of the take-out electrode is reduced so that the luminous efficiency is improved.

Example 9

The example of the light emitting device with the structure shown in FIG. 2C formed in the steps shown in FIGS. 12A to 12D will be explained below.

The same steps as in Example was carried out in except that after the hydrogen ion implanting step, the porous layer was subjected to an RTO treatment. After the oxide film on the top surface of the porous layer had been removed, an nm-type silicon layer of about 200 Å was epitaxially grown by using a bias sputtering method in which a n-type silicon with a high concentration was used as a target. In an observation of the cross section of an observation sample, some defects including dislocations and twins in the epitaxial silicon layer were found. However, it was confirmed that the crystal structure was continued from the underlying porous layer as a whole.

After it had been confirmed that the porous layer oxidized and with an increased PL efficiency is sufficiently stabilized, a $SiO_2$ film about 2000 Å thick was again deposited on the surface of the wafer by using a CVD process. Using a conventional photolithography process, some openings of $2 \times 2$ mm$^2$ were formed in the oxide film. Moreover, a semi-transparent gold film of a thickness of 100 Å was vapor-deposited in the openings to wire the take-out electrodes A1 derived from the openings.

When a direct current was conducted between the electrodes on the back surface of the above wafer, the device produced by the above steps indicated a rectification characteristic in which a forward current flows to the surface electrode acting as a cathode electrode. An area light emission of nearly orange visible rays was emitted from the openings in the oxide film at a threshold voltage of about 2 volts. It is considered that this light emission is due to an electroluminescence based on a current injection to the porous silicon layer with the ultra-fine structure via the junction interface between the n-type epitaxial crystal layer and the underlying p-type porous layer. It is presumed that the sufficiently low luminous threshold voltage for practical use results from the pn-junction interface having a continuous crystal structure and good rectification characteristics and therefore the current injection efficiency is very high.

Example 10

An explanation will be made as for an example of a light emitting device having the structure shown in FIG. 2D produced in the forming steps shown in FIG. 13.

The device was prepared in the same manner as in the Example 9 except that before converting the surface of a p-type monocrystalline substrate into a porous structure, boron ions with a dose of $5 \times 10^{14}$ cm$^{-2}$ were implanted to the surface thereof at an acceleration voltage of 20 KeV. Then the implanted surface was activated by annealing in a nitrogen atmosphere at 950° C. for 30 minutes. An observation of the cross-section of a sample found that the ultra-thin layer of about 0.05 Mm in the top surface side of the porous layer was in a porous state with bulky structure and that the epitaxial layer thereon included nearly no defects, and it can be stated that it is nearly a monocrystal. It is considered that eh epitaxial layer having a crystallinity better than that in the Example 7 results from the epitaxially grown surface with bulky porous structure.

On conducting a direct current between the electrodes on the front and back surfaces of the wafer, the rectification characteristics and luminous threshold voltage of the device were substantially the same as those in the Example 9 and the luminous efficiency was improved several times, as compared with that in the Example 9. In this case, it is considered that the crystallinity of the n-type epitaxial silicon layer in the top surface reduced the contact resistance of the interface so that the luminous efficiency was improved.

Example 11

An explanation will be made as for an Example of a light emitting device having the structure shown in FIG. 3D explained in the forming steps of FIGS. 14A to 14F.

First, a SOI substrate having a boron-doped p-type silicon monocrystalline thin film with a face orientation of <100> and a thickness of 0.5 Mm formed on a transparent quartz substrate was provided. The SOI substrate was subjected to the LOCOS process to form $10 \times 10$ μm$^2$ element separation regions. The surfaces of the separated silicon island were oxidized to about 500 Å. Then with a stripe of 1.5 μm width being left at the middle portion of the island, boron ions accelerated at 159 keV were implanted with a dose of $2 \times 10^{15}$ cm$^{-2}$ into the right region and phosphorous ions accelerated at 150 keV were implanted with a dose of $3 \times 10^{15}$ cm$^{-2}$ into the left region. The substrate was subjected to a thermal annealing in a nitrogen atmosphere at 950° C. for 30 minutes to activate it. Next, aluminum wirings were formed in contact with the right and left ion implanted regions. Particularly, the wiring from the boron implanted region was wound to the orientation flat of the substrate. Then a conventional photoresist was coated on the surface of the substrate. An opening was formed in the non-ion-implanted stripe region left at the middle area of the silicon island at the surface side. The end of the opening at the pn-junction side was offset so as to overlap slightly the inner side of the stripe region from the junction boundary. Then the oxide film on the surface in the opening was removed.

The substrate was subjected to an anodizing process by immersing in a hydrofluoric acid-ethanol solution of a concentration of 25 wt. % while a direct current was conducted between a platinum plate electrode acting as a cathode facing the substrate and the aluminum wirings wound to the orientation flat of the substrate. The anodizing process was completed in 30 seconds while the anodizing current density was controlled at a fixed value of about 20 mA.cm$^{-2}$ at the photoresist opening on the surface of the substrate. Then the photoresist was removed from the substrate. A SiNx film was deposited on the entire surface of the substrate by suing a plasma CVD process. An opening was formed at a portion where the aluminum wiring was needed.

An observation of the cross section of the device found that the 1.4 Mm width stripe region at the middle portion of the silicon island became a porous structure. It is probably seemed that a predetermined intermediate layer with a width of less than about 0.1 μm is formed at the pn-junction boundary.

On conducting a direct current between two electrodes sandwiching the porous region in the device, the device indicated its good rectification characteristics. A luminescence was recognized from a small applied voltage of about 1 volt.

Example 12

An explanation will be made below as for an Example of a light emitting device having the structure shown in FIG. 3D produced in accordance with the steps in FIGS. 5A to 5C.

First, SIMOX substrate having a phosphorus-doped n-type silicon monocrystalline thin film with a face orientation of <100>, a resistivity of 20 Ω.cm, and a thickness of 0.5 μm formed on a buried oxide film of 3000 Å thick was provided. The SIMOX substrate was immersed in a hydrofluoric acid solution of a concentration of 49 wt. Photoformation was carried out by irradiating a He—Ne laser beam focused in a rectangular shape of 2×8 μm² onto a part of the substrate surface for 30 minutes. Next, the substrate was subjected to the RTO process to stabilize the porous region. According to the same steps as those in the Example 11, an ion implantation was performed to the two regions sandwiching the porous region to isolate electrically them. The element separation step using the LOCOS process activates the implanted ions. In this case, the phosphorus ion-implanted region was spaced from the porous region by 0.1 μm, and the boron ion-implanted region was spaced from the porous region by 0.2 μm. Thus, the horizontal diffusion during an activation annealing was ceased at or just before the boundary of the porous region. An intermediate layer was formed between the boron implanted region and the porous region. Finally, aluminum wirings were derived out of both the ion implanted regions so that a device was completely formed.

On conducting a direct current between two electrodes sandwiching the porous region in the device, it was indicated that this device has good rectification characteristics. It was ensured that a light emission occurred at a small applied voltage of about 1.5 volts.

Example 13

An explanation will be made below as for an example of driving a light emitting device drive by an electrical circuit which is, fabricated on the same substrate including the light emitting device shown in the Example 11, with reference to FIGS. 16A to 16E and 17A to 17D.

Figure 16A:
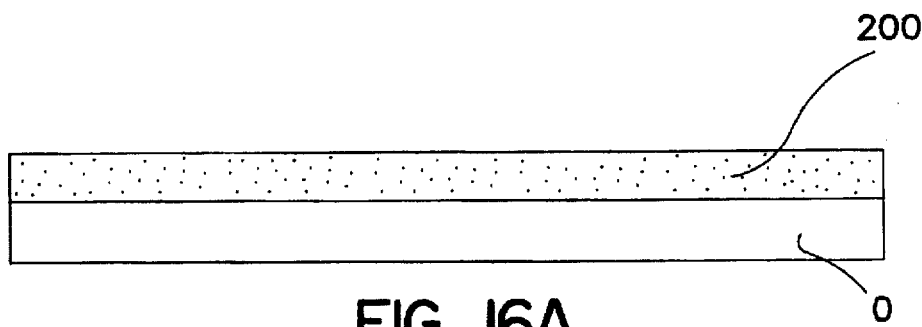
FIGS. 16A to 16E are schematic diagrams showing an embodiment of a light emitting device manufacturing process according to the present invention.
Figure 16B:
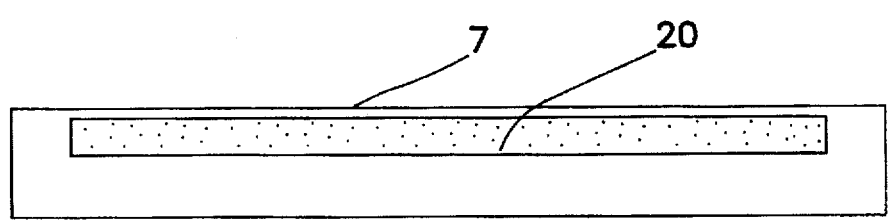
Figure 16C:
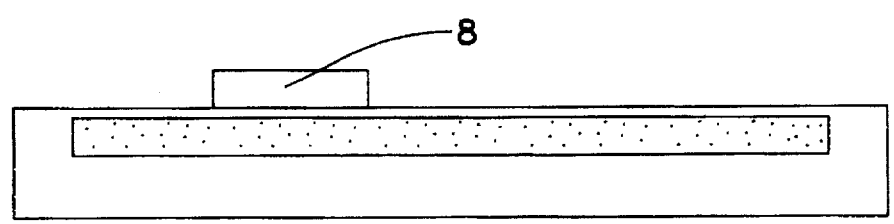
Figure 16D:
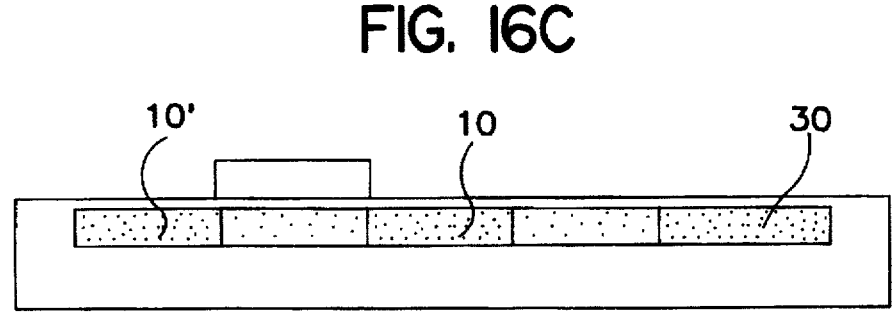
Figure 16E:
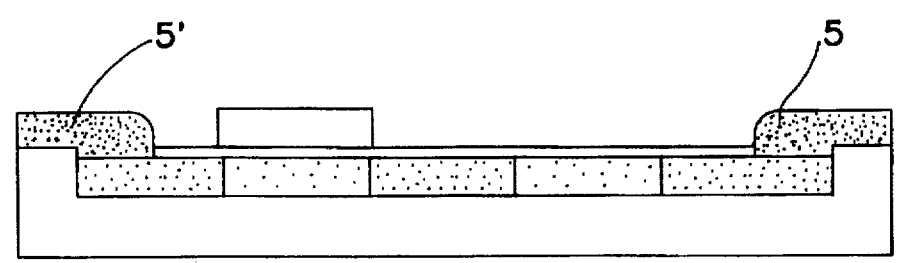
Figure 17A:
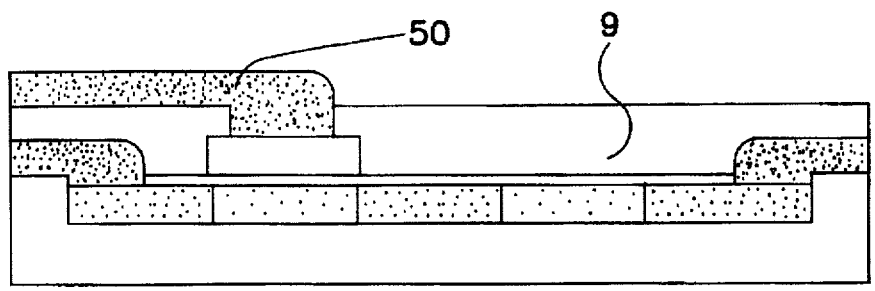
FIGS. 17A to 17D are schematic diagrams showing an embodiment of a light emitting device manufacturing process according to the present invention.
Figure 17B:
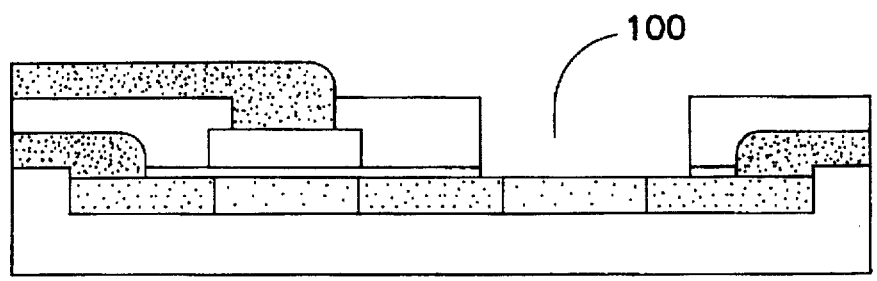
Figure 17C:
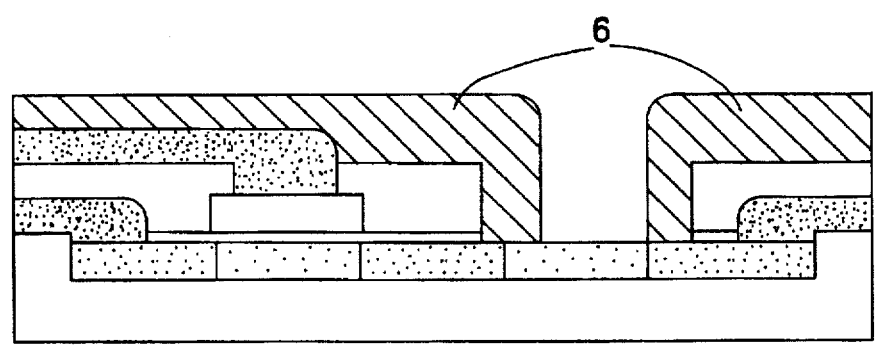

First, SOI substrate having a boron-doped p-type silicon monocrystalline film 200 with a face orientation of 100>, a resistivity of 10 Ω.cm, and a thickness of 0.5 μm formed on an insulation surface of a silicon substrate 0 was provided (FIG. 16A). The substrate was subjected to an element isolation by using the LOCOS process to form island regions 20 each having an area of 10×μm². A 500 Å thick oxide film 7 was formed on the surface of each isolated silicon island by using a thermal oxidizing process (FIG. 16B). Next, a polycrystalline silicon film 0.5 μm thick was deposited on the surface of the oxide film 7 by using the LPCVD process. The polycrystalline silicon film was patterned through a conventional photolithography process so as to leave the 2 μm wide island region 8 (FIG. 16C). Then, with the photoresist acting as a patterned mask, phosphorus ions with a dose of 2×10¹⁵ cm⁻² accelerated at 180 keV were locally implanted to the polycrystalline silicon film island region 8 as well as the parts 10 and 10' of the silicon monocrystalline film island region 20 at the both sides of the region 8. Moreover, boron ions with a dose of 1×10¹⁵ cm⁻² accelerated at 100 keV were implanted to a part 30 of the silicon monocrystalline film island region 20 by using the above step (FIG. 16D). The impurities were activated by a thermal process at 900° C. for 30 minutes. The oxide films on the surfaces of the regions 30 and 10' were removed, and then aluminum wirings 5 and 5' were taken out of the openings (FIG. 16E). Then the silicon oxide film 9 wa deposited on the surface of the resultant substrate and the aluminum wiring 50 was taken out to conduct to the silicon monocrystalline film island region 9 (FIG. 17A). Next, the opening 100 was formed on a part of the upper part of the silicon monocrystalline film island 20 (FIG. 17B). The silicon nitride film 6 was formed so as to leave an opening of 1.5 μm wide with a slight offset to the region 10 (FIG. 17C). Finally, the region 2 opened in the same way as that in the Example 11 was converted to a porous layer.

Figure 17D:
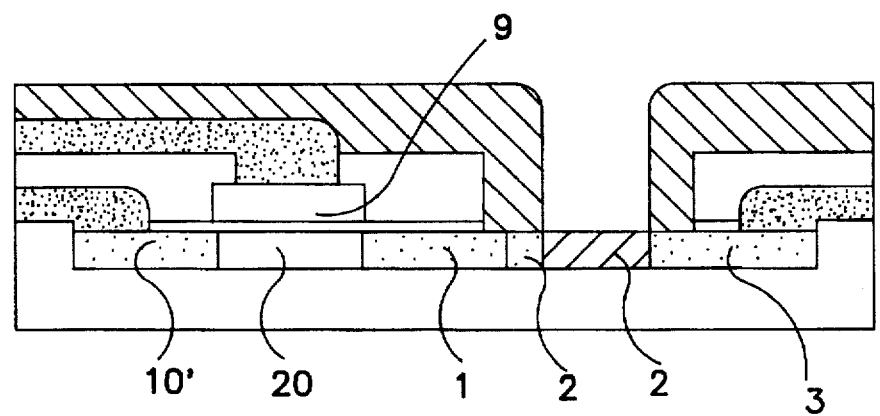

A light emitting device which includes the regions 10 and 30 corresponding to the ion-implanted electrode regions 1 and 3 shown in FIG. 14F, the region 2 corresponding to the porous region 2 including a light emitting region, and the offset region corresponding to the intermediate region 2' was formed according to the above steps (FIG. 17D). The ion-implanted electrode region 1 acts as the drain region of a MOS transistor including the region 10' acting as a source part, the region 20 acting as a channel part, and the polycrystalline silicon film island region 9 acting as a gate electrode. With a voltage of 15 volts applied between the wirings 5 and 5', when the gate voltage was increased from 0 via the wiring 50, the MOS transistor was turned on at a threshold voltage 1.1 volts. It was confirmed that the porous region including a light emitting region glowed at 1.5 volts and more. The relationship between the luminous intensity and gate voltage indicated linear characteristics over 2 volts. When a rectangular waveform of 5 volts was applied to the gate of a MOS transistor from a shift register separately formed on the same substrate, the light emitting device can follow even at 20 MNz.

The following features can be understood from the above explanations.

A light emitting device according to the present invention has a device constitution comprising a non-porous region having a continuous crystal structure adjacent to the luminous region including a porous material and acting as a current injection electrode to the luminous region, whereby the perfect adhesion between the electrode and the luminous region reduces the contact resistance. By differentiation the conductive types of the non-porous region and the luminous region from each other, current injection from the junction portion can be achieved with high efficiency. As a result, a light emitting device with excellent luminous efficiency and for a practical use can be provided as a whole device. According to the present invention, the light emitting device manufacturing method can provide light emitting devices with good luminous efficiency.

What is claimed is:

1. A light emitting device comprising a porous crystalline semiconductor material region which acts as a luminous region and a non-porous region adjacent to the luminous region, wherein the porous region has plural porous layers which differ from each other, and wherein a conductive type between the regions is different at an interface between the luminous region and the non-porous region and the crystal structure between the regions is continuous.

2. A light emitting device according to claim 1, wherein a low resistance region having the same conductive type as that of the luminous region is further adjacent to the luminous region with a crystal structure being continuous.

3. A light emitting device according to claim 1, wherein the plural porous layers are different in composition and structure.

4. A light emitting device according to any one of claims 1 to 3, wherein the non-porous region is constituted of a monocrystal.

5. A light emitting device according to claim 3, wherein a heterogeneous material is formed on the porous material.

6. A light emitting device comprising:
- a luminous region comprising a porous semiconductor having a first conductivity type;
- a contact region comprising a non-porous semiconductor having a second conductivity type, electrically connected to the luminous region;
- an electrode provided at the contact region; and
- an intermediate region comprising a non-porous semiconductor having a first conductivity type, provided between the luminous region and the contact region, wherein current is passed from the electrode to the luminous region through the contact region and the intermediate region, whereby the luminous region emits light.

7. A light emitting device according to claim 6, wherein the luminous region, the intermediate region and the contact region are formed in layers and laminated successively.

8. A light emitting device according to claim 6, wherein the luminous region, the intermediate region and the contact region are formed on the same substrate in a direction parallel to a surface of the substrate.

9. A light emitting device according to any one of claims 6 to 8, wherein the luminous region and the intermediate region comprise a p-type porous silicon and the contact region comprises an n-type silicon.

* * * * *

UNITED STATES PATENT AND TRADEMARK OFFICE
CERTIFICATE OF CORRECTION

PATENT NO. : 5,726,464

DATED : March 10, 1998

INVENTOR(S): HIDEYA KUMONI ET AL.

It is certified that error appears in the above-identified patent and that said Letters Patent is hereby corrected as shown below:

```
On the title page, Item
[56] REFERENCES CITED

Other Publications
   In "Applied Physics", "electroluninesence" should read
      --electroluminescence-- and
      "hetrojunction" should read --heterojunction--.

COLUMN 1

Line 66, "been" should be deleted.

COLUMN 2

Line 2, "is which" should read --in which--.
   Line 8, "Appl, Physl, Letter, 61" should read
      --Appl. Physl. Lett. 61,--.
   Line 9, "1552(1992)." should read --1552 (1992).--.
   Line 30, "alight" should read --a light--.
   Line 33, "alight" should read --a light--.
   Line 52, "-diagrams" should read --diagrams--.
   Line 58, "diagram" should be deleted.
   Line 62, "diagram" should be deleted.

COLUMN 3

Line 13, "FIGS." should read --FIG.--.
   Line 16, "schematic" should read --are schematic--.
   Line 19, "FIGS." should read --FIG.--.
```

UNITED STATES PATENT AND TRADEMARK OFFICE
CERTIFICATE OF CORRECTION

PATENT NO. : 5,726,464

DATED : March 10, 1998

INVENTOR(S): HIDEYA KUMONI ET AL.

It is certified that error appears in the above-identified patent and that said Letters Patent is hereby corrected as shown below:

COLUMN 3 (CONTINUED)

Line 38, "form" should read --from--; and
      "that" should be deleted.

COLUMN 4

Line 9, "form" should read --from--.
  Line 18, "of an" should read --of a--.
  Line 21, "materials" should read --material--.
  Line 29, "regions" should read --region--.
  Line 36, "form" should read --from--.

COLUMN 5

Line 5," then" should read --than--.
  Line 60, "provide" should read --provided--.
  Line 66, "be same" should read --be the same--.

COLUMN 6

Line 22, "Fist," should read --First,--.
  Line 47, "whose" should read --shown--.
  Line 63," each" should read --each of--.
  Line 67, "must" should read --just--.

UNITED STATES PATENT AND TRADEMARK OFFICE
CERTIFICATE OF CORRECTION

PATENT NO. : 5,726,464

DATED : March 10, 1998

INVENTOR(S) : HIDEYA KUMONI ET AL.

It is certified that error appears in the above-identified patent and that said Letters Patent is hereby corrected as shown below:

COLUMN 7

Line 20, "is a" should read --in a--.
    Line 23," IN" should read -- In--.
    Line 30, "has" should read --has a--.

COLUMN 8

Line 15, "shown if" should read --shown in--.
    Line 54, "substrate)" should read --substrate 0--.
    Line 62, "substrate)" should read --substrate 0--.

COLUMN 9

Line 38, "20 a" should read --20 as--.
    Line 63, "having a" should read --having an--.

COLUMN 10

Line 64, "opening s" should read --openings--.

COLUMN 11

Line 30, "in" should be deleted.
    Line 42, "ration" should read --ratio--.
    Line 56, "manufacture" should read --manufactured--.
    Line 67, "wager" should read --wafer--.

UNITED STATES PATENT AND TRADEMARK OFFICE
CERTIFICATE OF CORRECTION

PATENT NO. : 5,726,464

DATED : March 10, 1998

INVENTOR(S) : HIDEYA KUMONI ET AL.

It is certified that error appears in the above-identified patent and that said Letters Patent is hereby corrected as shown below:

COLUMN 12

Line 4, "Mm" should read --$\mu$m--.
   Line 24, "or" should read --of--.

COLUMN 13

Line 2, "with a" should read --with an--.
   Line 6, "low sufficiently" should read
     --sufficiently low--.
   Line 24, "ration" should read --ratio begin--.
   Line 29, "from and" should read --front and--.
   Line 52, "of a" should read --of an--.
   Line 53, "the from" should read --the front--.
   Line 65," an light" should read --a light--.

COLUMN 14

Line 8, "thick" should read --thickness--.
   Line 13, "was" should be deleted.
   Line 35, "thick" should read --thickness--.
   Line 48, "was" should read --were--;
     and "same" should read --the same--.
   Line 63, "Example" should read --Example 6--;
     "was" should read --were--; and "in" should be
     deleted.

UNITED STATES PATENT AND TRADEMARK OFFICE
CERTIFICATE OF CORRECTION

PATENT NO. : 5,726,464

DATED : March 10, 1998

INVENTOR(S): HIDEYA KUMONI ET AL.

It is certified that error appears in the above-identified patent and that said Letters Patent is hereby corrected as shown below:

COLUMN 15

Line 1, "which a" should read --which an--.
    Line 10, "a $SiO_2$" should read --an $SiO_2$--.
    Line 46, "Mm" should read --$\mu$m--.
    Line 50, "eh" should read --the--.
    Line 64, "Example" should read --example--.

COLUMN 16

Line 3, "Mm" should read --$\mu$m--.
    Line 39, "suing" should read --means of--.
    Line 43, "Mm" should read --$\mu$m--.
    Line 57, "Example" should read --example--.
    Line 64, "thick" should read --thickness--.

COLUMN 17

Line 6, "electrically them." should read --them electrically.--.
    Line 29, "is," should read --is--.
    Line 39, "10x$\mu$m$^2$." should read --10x10$\mu$m$^2$.--.
    Line 61, "wa" should read --was--.

UNITED STATES PATENT AND TRADEMARK OFFICE
CERTIFICATE OF CORRECTION

PATENT NO. : 5,726,464

DATED : March 10, 1998

INVENTOR(S) : HIDEYA KUMONI ET AL.

It is certified that error appears in the above-identified patent and that said Letters Patent is hereby corrected as shown below:

<u>COLUMN 18</u>

```
Line 20, "alight" should read --a light--.
Line 37, "the" (second occurrence) should read
    --of the--.
```

Signed and Sealed this

Twenty-ninth Day of December, 1998

Attest:

BRUCE LEHMAN

*Attesting Officer*     *Commissioner of Patents and Trademarks*